United States Patent
Satoh et al.

(10) Patent No.: US 7,122,945 B2
(45) Date of Patent: Oct. 17, 2006

(54) TUNING FORK RESONATOR, TUNING FORK UNIT, AND METHOD FOR PRODUCING TUNING FORK RESONATOR

(75) Inventors: Syunsuke Satoh, Kakogawa (JP); Tomo Fujii, Kakogawa (JP)

(73) Assignee: Daishinku Corproation, Hyogo (JP)

( * ) Notice: Subject to any disclaimer, the term of this patent is extended or adjusted under 35 U.S.C. 154(b) by 0 days.

(21) Appl. No.: 10/527,746

(22) PCT Filed: Jul. 20, 2004

(86) PCT No.: PCT/JP2004/010598

§ 371 (c)(1),
(2), (4) Date: Mar. 14, 2005

(87) PCT Pub. No.: WO2005/008888

PCT Pub. Date: Jan. 27, 2005

(65) Prior Publication Data
US 2005/0285483 A1   Dec. 29, 2005

(30) Foreign Application Priority Data
Jul. 22, 2003   (JP) .............................. 2003-200079

(51) Int. Cl.
*H03H 9/21* (2006.01)
(52) U.S. Cl. ....................................... 310/370
(58) Field of Classification Search ................ 310/370, 310/366
See application file for complete search history.

(56) References Cited

U.S. PATENT DOCUMENTS

| 4,252,839 | A | 2/1981 | Wakasugi |
| 6,700,313 | B1 * | 3/2004 | Dalla Piazza et al. ...... 310/370 |
| 2003/0080652 | A1 | 5/2003 | Kawashima |

FOREIGN PATENT DOCUMENTS

| JP | 62-4888 | | 2/1987 |
| JP | 52-52597 | | 4/1997 |
| JP | 2002076806 | A * | 3/2002 |
| JP | 2003-133895 | | 5/2003 |
| JP | 2003-204240 | | 7/2003 |

* cited by examiner

*Primary Examiner*—Thomas M. Dougherty
(74) *Attorney, Agent, or Firm*—Wenderoth, Lind & Ponack, L.L.P.

(57) ABSTRACT

A tuning fork resonator includes a base portion and leg portions extending from the base portion. A groove portion is formed in a major surface of each leg portion. An in-groove electrode is formed in the groove portion. A side surface electrode is formed on a side surface of the leg portion. The in-groove electrode and the side surface electrode are connected via a base portion electrode formed in the base portion. An outward extending groove electrode extending on a vertical wall facing the base portion and a leg portion tip-side major surface from the in-groove electrode of the groove portion, and a beside-groove electrode for leading the outward extending groove electrode on the leg portion major surface along beside the groove portion to the base portion electrode, are formed.

19 Claims, 9 Drawing Sheets ure fork resonator, and a method for producing the tuning fork resonator. More particularly, the present invention relates to an improvement for avoiding a failure, such as a break in an in-groove electrode, a short circuit between electrodes formed on a surface of a resonator, or the like.

TUNING FORK RESONATOR, TUNING FORK UNIT, AND METHOD FOR PRODUCING TUNING FORK RESONATOR

TECHNICAL FIELD

The present invention relates to a tuning fork resonator, a tuning fork unit comprising the tuning fork resonator, and a method for producing the tuning fork resonator. More particularly, the present invention relates to an improvement for avoiding a failure, such as a break in an in-groove electrode, a short circuit between electrodes formed on a surface of a resonator, or the like.

BACKGROUND ART

Conventionally, a tuning fork crystal unit, which can be easily made small, has been known as a type of piezoelectric device. This type of crystal unit is disclosed in, for example, JP 2002-76806A. The crystal unit comprises a tuning fork crystal resonator that is produced by etching a crystal wafer into a shape of a tuning fork and forming a predetermined electrode on a surface thereof by utilizing a photolithography technique. A groove is formed at a middle portion of each of top and bottom surfaces of each leg portion (leg portion major surface) of the tuning fork crystal resonator. When the groove portion is thus formed on the top and bottom surfaces of the leg portion, even a small resonator can suppress a loss of vibration in the leg portion, thereby making it possible to suppress the crystal impedance (CI) value to a small level. Thus, the groove portion is effective. This type of tuning fork crystal unit is particularly suitably mounted on precision apparatuses, such as a clock and the like.

A shape of the electrode formed on the surface of this type of tuning fork crystal resonator will be hereinafter described.

FIG. 9 shows a tuning fork crystal resonator a that is included in a general tuning fork crystal unit. The tuning fork crystal resonator a comprises two leg portions b, c. First drive electrodes d1, d2 and second drive electrodes e1, e2 are formed in each of the leg portions b, c. In FIG. 9, portions in which the drive electrodes d1, d2, e1, e2 are formed are hatched.

Also in the tuning fork crystal resonator a, rectangular groove portions b2, c2 are formed on leg portion major surfaces b1, c1, which are top and bottom surfaces of the leg portions b, c, respectively.

The first drive electrode is composed of an in-groove electrode d1 that is formed in a groove portion b2 formed on the top and bottom surfaces (leg portion major surface) b1 of the leg portion b, and a side surface electrode d2 that is formed on a side surface c3 of the leg portion c. The in-groove electrode d1 and the side surface electrode d2 are connected via a connecting electrode f.

Similarly, the second drive electrode is composed of an in-groove electrode e1 that is formed in a groove portion c2 formed on the top and bottom surfaces (leg portion major surface) c1 of the leg portion c, and a side surface electrode e2 that is formed on a side surface b3 of the leg portion b. The in-groove electrode e1 and the side surface electrode e2 are connected via a connecting electrode g.

These electrodes are a thin film composed of, for example, a chromium (Cr) underlying electrode layer and a gold (Au) top electrode layer. The film is formed on the entire surface using a technique, such as vacuum deposition or the like, and is then formed into a desired shape by metal etching using a photolithography technique.

Note that the formation of the electrode using vacuum deposition has the following benefit. The thicknesses of the underlying electrode layer (chromium) and the top electrode (gold) can be easily controlled, resulting in desired electrical characteristics. Also, by controlling a deposition apparatus in an appropriate manner, high film quality can be obtained.

In the above-described tuning fork crystal resonator, the in-groove electrode is formed from a bottom surface of the groove portion to a vertical wall (a surface perpendicular to the leg portion major surface) and the leg portion major surface. Therefore, a connection between the in-groove electrode and the connecting electrode is unstable in the vicinity of an edge (a border between the groove portion and the leg portion major surface), likely leading to a break. Particularly, when the electrode is formed using vacuum deposition, the bottom surface and the vertical wall (a surface perpendicular to the leg portion major surface) of the groove portion closer to a base portion of the resonator are likely to be blocked from the view of a deposition source, so that the connection between the in-groove electrode and the connecting electrode is unstable and a break is likely to occur.

In addition, when the photolithography technique is used to form the in-groove electrode in the groove portion, the surface of a resist liquid is bulged upward due to its surface tension in the vicinity of an edge of the groove portion (a border between the groove portion and the leg portion major surface), resulting in a reduction in etching precision of the in-groove electrode. In this case, since an outer edge of the in-groove electrode is not appropriately shaped, a break is likely to occur between the in-groove electrode and the connecting electrode, or the in-groove electrode is made contact with the connecting electrode or the side surface electrode at a crotch portion of the tuning fork crystal resonator, resulting in occurrence of a short circuit.

These problems are significant in a micro-crystal unit (e.g., the width of the leg portion is about 120 μm) that has been recently much developed.

As described above, in the tuning fork crystal resonator in which the leg portion has a groove portion and an in-groove electrode is provided in the groove portion, an electrical failure, such as a break in the electrode, a short circuit between the electrodes or the like, is likely to occur due to the presence of the groove portion and the in-groove electrode. Therefore, a further improvement in structure is required for the above-described type of tuning fork crystal resonator.

The present invention is provided to solve the problems. An object of the present invention is to provide a tuning fork crystal resonator and a tuning fork unit in which a groove portion is provided in a leg portion thereof and an drive electrode (in-groove electrode) is formed in the groove portion and that can avoid an electrical failure that is otherwise caused by the electrode formed on a surface of the resonator.

BRIEF SUMMARY OF THE INVENTION

To achieve the above-described object, a tuning fork crystal resonator according to the present invention comprises a base portion and a plurality of leg portions extending in the same direction from the base portion in parallel to one another, in which a groove portion is formed in a major surface of each leg portion, an in-groove electrode is formed in the groove portion, a side surface electrode is formed on a side surface of the leg portion, and the in-groove electrode and the side surface electrode are connected via a base portion electrode formed in the base portion. An outward extending groove electrode extending on at least one of a vertical wall facing the base portion of the groove portion and a vertical wall that is a side surface of the groove portion and a leg portion tip-side major surface from the in-groove electrode of the groove portion, and a beside-groove electrode for leading the outward extending groove electrode on the leg portion major surface along beside the groove portion to the base portion electrode, are formed. In this case, the beside-groove electrode may be separated from an edge of the groove portion.

According to the present invention, the outward extending groove electrode and the beside-groove electrode are formed, whereby an electrical failure that is otherwise caused by the electrode formed on the surface of the tuning fork crystal resonator can be avoided. Specifically, the in-groove electrode and the side surface electrode are each led from the in-groove electrode of the groove portion via the outward extending groove electrode and the beside-groove electrode to the base portion electrode, resulting in a reliable connection. For example, the in-groove electrode of the groove portion is led from an edge portion on the base portion side thereof to the base portion electrode to provide a first conductive path. The in-groove electrode of the groove portion is led via the outward extending groove electrode and the beside-groove electrode to the base portion electrode to provide a second conductive path. The in-groove electrode and the side surface electrode are more reliably connected to each other by the first and second conductive paths. Since there are a plurality of conductive paths, it is possible to reduce a risk such that a connection between the in-groove electrode and the base portion electrode is unstable in the vicinity of an edge portion of the groove portion (in the vicinity of a border between the groove portion and the leg portion major surface). By providing only the second conductive path in the tuning fork crystal resonator, it is possible to avoid an electrical failure that is otherwise caused by the electrode formed on the surface of the tuning fork crystal resonator. Further, by providing the first conductive path and the second conductive path in the tuning fork crystal resonator, it is possible to more preferably avoid an electrical failure that is otherwise caused by the electrode formed on the surface of the tuning fork crystal resonator.

Thus, with the tuning fork crystal resonator in which a groove portion is provided in a leg portion thereof and an in-groove electrode is formed in the groove portion, a loss of vibration in the leg portion can be suppressed even when the size of the resonator is reduced, thereby making it possible to suppress the CI (crystal impedance) value to a small level. In addition, electrical failures, such as a break in the electrode, a short circuit between the electrodes, which are caused by the presence of the groove portion and the in-groove electrode, can be avoided.

Also in the above-described structure, the outward extending groove electrode may be formed on at least the vertical wall that is the side surface of the groove portion, and the beside-groove electrode may be integrated with the outward extending groove electrode.

In this case, the outward extending groove electrode is formed on at least the vertical wall that is the side surface of the groove portion, and the beside-groove electrode is integrated with the outward extending groove electrode. Therefore, the shape of the electrode is simplified, thereby making it possible to improve the productivity and the stability of a connection between the in-groove electrode and the base portion electrode in addition to the above-described operational effect.

Also in the above-described structure, the groove portion formed in each of the plurality of leg portions may be deviated from a center line of the leg portion in a width direction of the leg portion major surface, and the beside-groove electrode may be deviated from the center line in the width direction opposite to that of the deviated groove portion.

In this case, the groove portion formed in each of the plurality of leg portions is deviated from the center line of the leg portion in the width direction of the leg portion major surface, and the beside-groove electrode is deviated from the center line in the width direction opposite to that of the deviated groove portion, thereby making it possible to secure a region for forming the beside-groove electrode.

Also in the above-described structure, the groove portion may be deviated from the center line of the leg portion in a direction away from another leg portion parallel thereto, and the beside-groove electrode may be deviated from the center line of the leg portion in a direction approaching the other leg portion parallel thereto.

In this case, the position of the groove portion is deviated from the center in the direction away from the inner side surface electrode. Therefore, even in a situation such that the length extending on the leg portion major surface of the in-groove electrode is not appropriately obtained due to an influence of an edge of the groove portion, the in-groove electrode is suppressed from being made contact with the inner side surface electrode or the inner connecting electrode, thereby making it possible to avoid an electrical failure, such as a short circuit or the like, in addition to the above-described operational effect.

Further, since the major surface region is expanded to an inner portion of each leg portion, it is possible to form the beside-groove electrode in the expanded major surface region. Therefore, a stable electrode film free from occurrence of a break can be formed, resulting in a dramatically stable connection from the in-groove electrode to the base portion electrode. Furthermore, not only the in-groove electrode but also the beside-groove electrode can be used as drive electrodes. Therefore, a loss of vibration in the leg portion can be further suppressed, thereby making it possible to improve the CI (crystal impedance) value.

Also in the above-described structure, an electrode formed at an edge of the outward extending groove electrode may be thicker than an electrode formed at an edge on a base portion side of the groove portion.

In this case, the electrode formed at the edge of the outward extending groove electrode is thicker than the electrode formed at the edge on the base portion side of the groove portion. Therefore, a break is prevented from occurring in the vicinity of an edge of the groove portion in the second conductive path (in the vicinity of a border between the groove portion and the leg portion major surface), resulting in a dramatic increase in reliability of a connection from the in-groove electrode to the base portion electrode in addition to the above-described operational effect.

Also in the above-described structure, the vertical wall of the groove portion may be at a right or acute angle with respect to the leg portion major surface.

In this case, the vertical wall of the groove portion is at a right or acute angle with respect to the leg portion major surface. Therefore, for example, when an electrode is formed in the groove portion using a deposition apparatus, a wall of the groove portion may not be viewed directly from the deposition source, i.e., may be blocked from the direct view of the deposition source. However, according to the present invention, an electrode film can be stably formed even when there is the non-viewed wall of the groove portion (e.g., a vertical wall on the base portion side of the groove portion).

Also in order to achieve the above-described object, the tuning fork unit of the present invention is constructed so that a tuning fork crystal resonator having the above-described structure is mounted in a package.

The present invention comprises the above-described tuning fork crystal resonator, in which the tuning fork crystal resonator is mounted in a package. Therefore, the tuning fork crystal unit falls within the technical scope of the present invention. Specifically, this solving means can provide a tuning fork crystal unit that is highly reliable because of being free from a short circuit between electrodes and a break, and has a satisfactory CI value because of the groove portion.

Also in order to achieve the above-described object, a method for producing a tuning fork crystal resonator according to the present invention is provided. The tuning fork crystal resonator comprises a base portion and a plurality of leg portions extending in the same direction from the base portion in parallel to one another. A groove portion is formed in a major surface of each leg portion, an in-groove electrode is formed in the groove portion, and a side surface electrode is formed on a side surface of the leg portion. The in-groove electrode and the side surface electrode are connected via a base portion electrode formed in the base portion.

The method comprises disposing the tuning fork crystal resonator in a work holder in a state such that the tuning fork crystal resonator is spaced at a predetermined distance from a deposition source, an edge portion on a base portion side of the tuning fork crystal resonator is closer to the deposition source than an edge on a leg portion side thereof, and the leg portion major surface of the tuning fork crystal resonator is tilted with respect to the deposition source. The method also comprises evaporating an electrode material from the deposition source and applying the electrode material to the tuning fork crystal resonator, and forming an outward extending groove electrode extending on at least one of a vertical wall facing the base portion of the groove portion and a vertical wall that is a side surface of the groove portion and a leg portion tip-side major surface, and a beside-groove electrode for leading the outward extending groove electrode on the leg portion major surface along beside the groove portion to the base portion electrode.

According to the present invention, the outward extending groove electrode and the beside-groove electrode are formed, whereby an electrical failure that is otherwise caused by the electrode formed on a surface of the tuning fork crystal resonator can be avoided. Specifically, the in-groove electrode and the side surface electrode are each led from the in-groove electrode of the groove portion via the outward extending groove electrode and the beside-groove electrode to the base portion electrode (the above-described second conductive path), resulting in a reliable connection. For example, the in-groove electrode and the side surface electrode are more reliably connected to each other by the first and second conductive paths. By providing only the second conductive path in the tuning fork crystal resonator, it is possible to avoid an electrical failure that is otherwise caused by the electrode formed on the surface of the tuning fork crystal resonator. Further, by providing the first conductive path and the second conductive path in the tuning fork crystal resonator, it is possible to more preferably avoid an electrical failure that is otherwise caused by the electrode formed on the surface of the tuning fork crystal resonator.

The outward extending groove electrode providing the second conductive path is formed from the in-groove electrode of the groove portion to the vertical wall of the groove portion and the leg portion tip-side major surface while disposing the tuning fork crystal resonator in the work holder in a state such that the tuning fork crystal resonator is spaced at a predetermined distance from the deposition source, the edge portion on the base portion side of the tuning fork crystal resonator is closer to the deposition source than the edge on the leg portion side thereof, and the leg portion major surface of the tuning fork crystal resonator is tilted with respect to the deposition source. Therefore, a portion in the vicinity of an edge on the leg portion tip-side of the groove portion faces the deposition source, i.e., is not blocked from the view of the deposition source, resulting in a stable electrode film. Further, an electrode formed at an edge of the outward extending groove electrode is thicker than an electrode formed at an edge on a base portion side of the groove portion. Therefore, a break is prevented from occurring in the vicinity of an edge of the groove portion in the second conductive path (in the vicinity of a border between the groove portion and the leg portion major surface).

Specifically, the beside-groove electrode providing the second conductive path is also similarly stably formed without being blocked from the view of the deposition source. By combining the stably formed electrode films, i.e., the outward extending groove electrode and the beside-groove electrodes, it is possible to provide a highly reliable tuning fork crystal resonator free from a risk of a break between the in-groove electrode and the base portion electrode.

Further, the tuning fork crystal resonator is disposed in the work holder in a state such that the edge on the base portion side of the tuning fork crystal resonator is closer to the deposition source than the edge on the leg portion side thereof, and the leg portion major surface of the tuning fork crystal resonator is tilted with respect to the deposition source. Therefore, an electrode structure at a crotch portion of the tuning fork crystal resonator is blocked from the view of the deposition source, thereby making it possible to prevent the formation of an unnecessary electrode at the crotch portion of each leg portion that otherwise causes a short circuit of each side surface electrode.

Thus, with the tuning fork crystal resonator in which a groove portion is provided in a leg portion thereof and an in-groove electrode is formed in the groove portion, a loss of vibration in the leg portion can be suppressed even when the size of the resonator is reduced, thereby making it possible to suppress the CI (crystal impedance) value to a small level. In addition, electrical failures, such as a break in an electrode, a short circuit between electrodes, which are caused by the presence of the groove portion and the in-groove electrode, can be avoided.

DETAILED DESCRIPTION OF THE DRAWINGS

Figure 1:
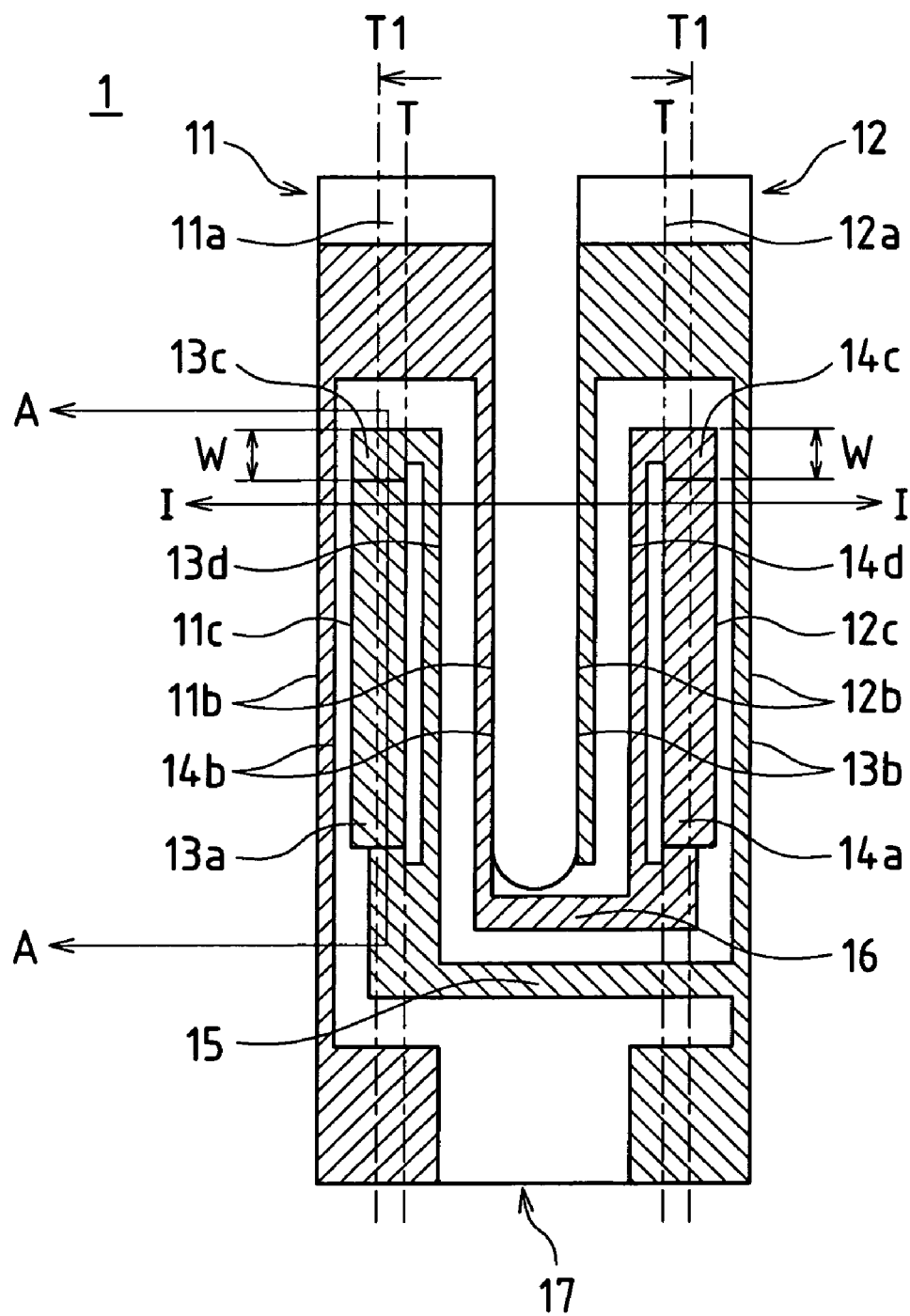
FIG. 1 is a plan view showing a tuning fork crystal resonator according to an embodiment of the present invention.
Figure 2:
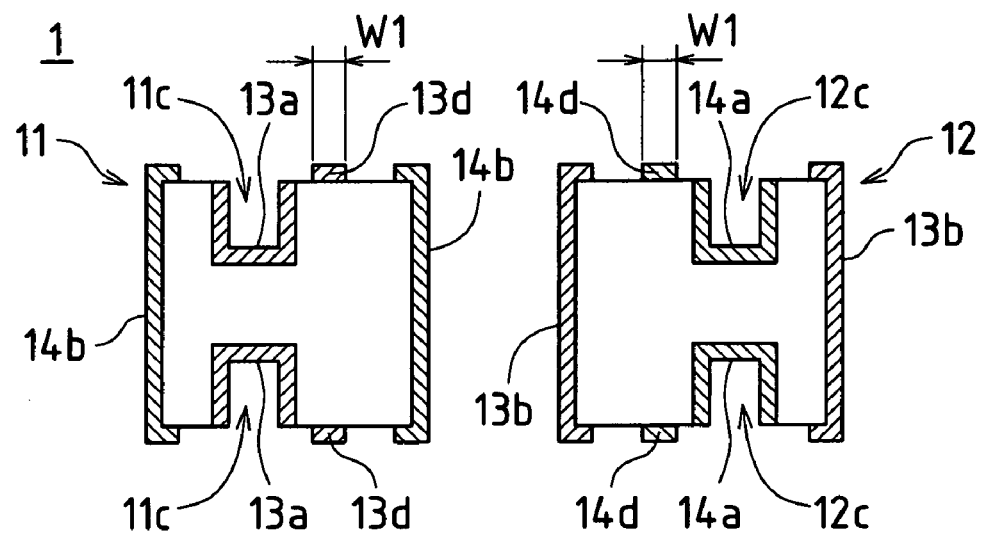
FIG. 2 is a cross-sectional view taken along line I—I in FIG. 1.
Figure 3:
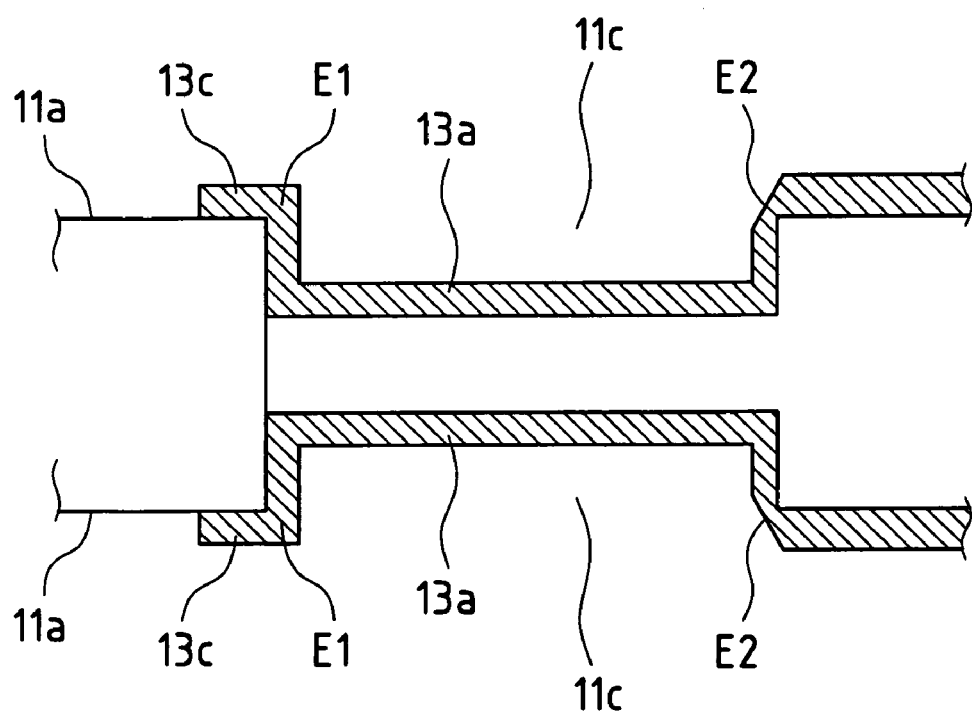
FIG. 3 is a cross-sectional view taken along line A—A in FIG. 1.

Hereinafter, embodiments of the present invention will be described with reference to the accompanying drawings. In the embodiments, the present invention is applied to a tuning fork crystal unit comprising two leg portions. FIG. 1 is a plan view showing a tuning fork crystal resonator 1 included in a tuning fork crystal unit according to an embodiment of the present invention. FIG. 2 is a cross-sectional view taken along line I—I in FIG. 1. FIG. 3 is a cross-sectional view taken along line A—A in FIG. 1.

The tuning fork crystal resonator 1 comprises a base portion 17, and two leg portions 11, 12 extending from the base portion 17 in the same direction in parallel to each other. In the leg portions 11, 12, first drive electrodes 13a, 13b and second drive electrodes 14a, 14b are formed, respectively. In FIG. 1, portions where the drive electrodes 13a, 13b, 14a, 14b are formed are hatched.

Further, in the tuning fork crystal resonator 1, rectangular groove portions 11c, 12c are formed on leg portion major surfaces 11a, 12a that are top and bottom surfaces of the respective leg portions 11, 12. The groove portions 11c, 12c have the same shape (width, length, depth) as each other. Vertical walls of the groove portions 11c, 12c are formed perpendicular to the leg portion major surface as shown in FIGS. 1, 2 and 3. As used herein, the term "perpendicular" is not limited to a perfect right angle with respect to the leg portion major surface, and may also refer to an angle that is tilted to some degree.

With the groove portions 11c, 12c thus formed on the top and bottom surfaces of the respective leg portions 11, 12, the vibration loss of the leg portions 11, 12 is suppressed even when the tuning fork crystal resonator 1 is miniaturized, resulting in a low CI (crystal impedance) value. Thus, the groove portions 11c, 12c are effective. Here, the groove portions 11c, 12c have the same shape as each other in order to reduce the vibration loss of the leg portions 11, 12 and suppress the CI value to a low level. Therefore, the shape of each groove portion 11c, 12c is not limited to this and may have any shape.

Note that the outer shape (the two leg portions, the base portion, etc.) of the tuning fork crystal resonator and the groove portion of each leg portion can be easily formed by using a photolithography technique, i.e., forming a resist film in a desired region on a crystal wafer and performing wet etching.

The first drive electrode is composed of the in-groove electrode 13a that is formed in the groove portion 11c formed on top and bottom surfaces (leg portion major surface) 11a of the leg portion 11 and the side surface electrode 13b that is formed on a side surface 12b of the leg portion 12, which are connected via a connecting electrode (base portion electrode) 15.

Similarly, the second drive electrode is composed of the in-groove electrode 14a that is formed in the groove portion 12c formed on top and bottom surfaces (leg portion major surface) 12a of the leg portion 12 and the side surface electrode 14b formed on a side surface 11b of the leg portion 11, which are connected via a connecting electrode (base portion electrode) 16.

In the in-groove electrodes 13a, 14a formed in the respective groove portions 11c, 12c, outward extending groove electrodes 13c, 14c are each formed on a vertical wall (a surface perpendicular to the leg portion major surface) of the groove portion and a leg portion major surface closer to a tip of the leg portion (leg portion tip-side surface). The outward extending groove electrodes 13c, 14c are led to the connecting electrodes (base portion electrodes) 15, 16 via beside-groove electrodes 13d, 14d formed in an inner portion of each leg portion and on the leg portion major surface along beside the groove portion. In this embodiment, for example, it is assumed that the leg portions 11, 12 each have a width of 120 μm and the groove portions 11c, 12c each have a width of 60 μm. In this case, the outward extending groove electrodes 13c, 14c each have a portion extending on the respective leg portion major surfaces 11a, 12a, which has a length (W) of about 10 to 30 μm, and the beside-groove electrodes 13d, 14d each have a width (W1) of about 10 μm. Therefore, the electrode film is stably formed, so that the conductive resistance is not reduced and a short circuit is unlikely to occur between the electrode film and the side surface electrode or the connecting electrode.

The above-described electrodes are a thin film composed of, for example, a chromium (Cr) underlying electrode layer and a gold (Au) top electrode layer. The film is formed on an entire surface of the tuning fork crystal resonator using vacuum deposition. A photolithography technique is used to form a resist film in a desired region on the entire electrode. Thereafter, the film is formed into a desired shape by metal etching. The film has a thickness of, for example, 0.2 μm.

The groove portions 11c, 12c and the in-groove electrodes 13a, 14a are formed at positions such that, for example, center positions T1 in a width direction of the groove portions 11c, 12c and the in-groove electrodes 13a, 14a are deviated from center positions T in a width direction of the leg portions 11, 12 in a direction heading away from the other one of the parallel leg portions (a direction away from a center line of the tuning fork crystal resonator; for example, about 20 μm). The beside-groove electrodes 13d, 14d are deviated from the center positions in the width direction of the leg portions 11, 12 in a direction approaching the other one of the parallel leg portions (a direction approaching from a vibration center position).

This structure makes it possible to secure a great distance between inner edges of the groove portions 11c, 12c and the in-groove electrodes 13a, 14a and inner edges of the leg portions 11, 12. The degree of freedom can be increased in terms of the width of the beside-groove electrode, the lengths extending on the leg portions 11a, 12a of the side surface electrodes 13b, 14b, and the lengths extending on the leg portion major surfaces 11a, 12a of the connecting electrode 16. In the design of FIG. 1, the broad beside-groove electrodes 13d, 14d are formed on the expanded leg portion major surface region, whereby a stable electrode film free from occurrence of a break can be formed.

Figure 4:
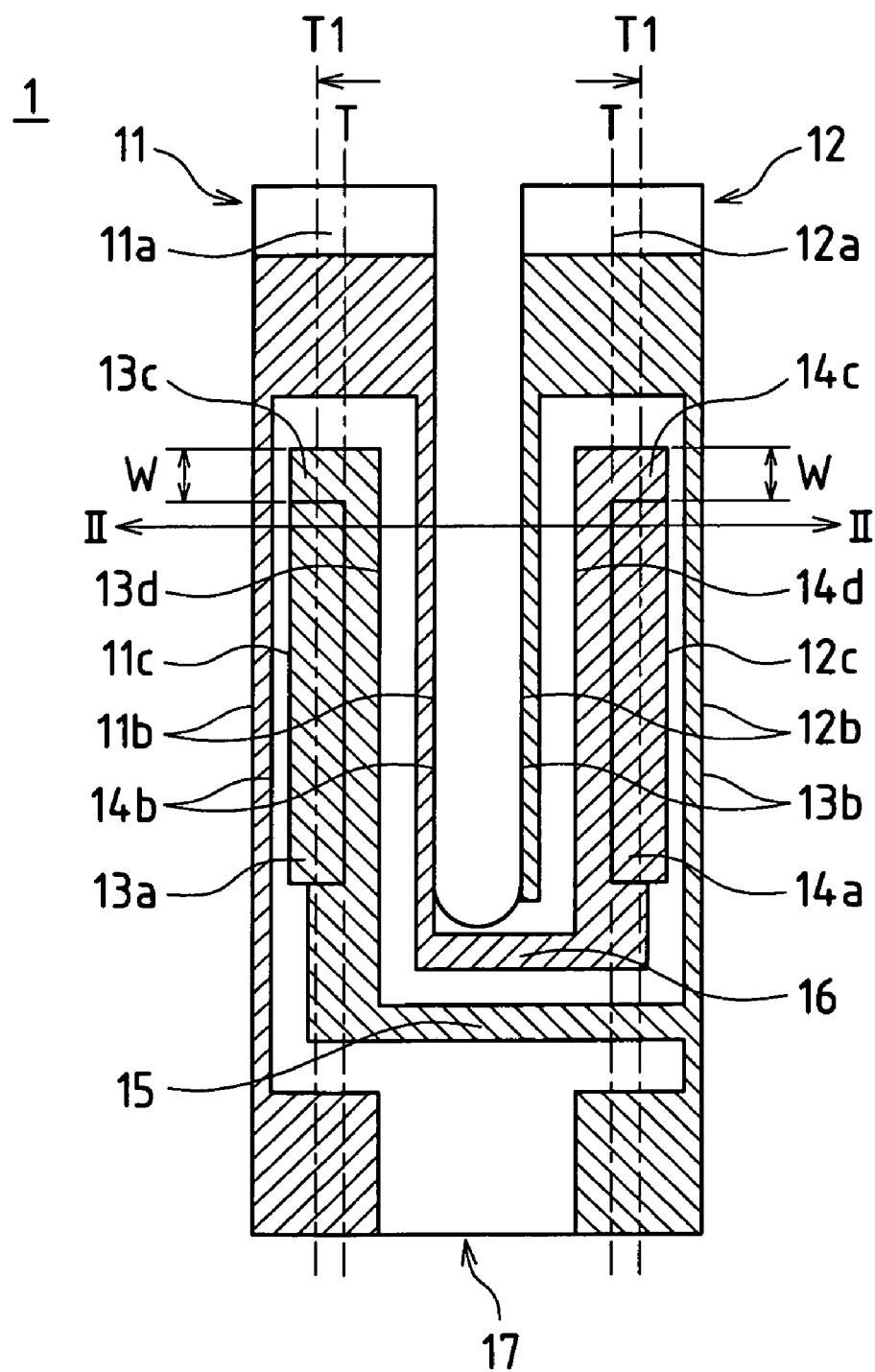
FIG. 4 is a diagram corresponding to FIG. 1 when a beside-groove electrode is integrally formed.
Figure 5:
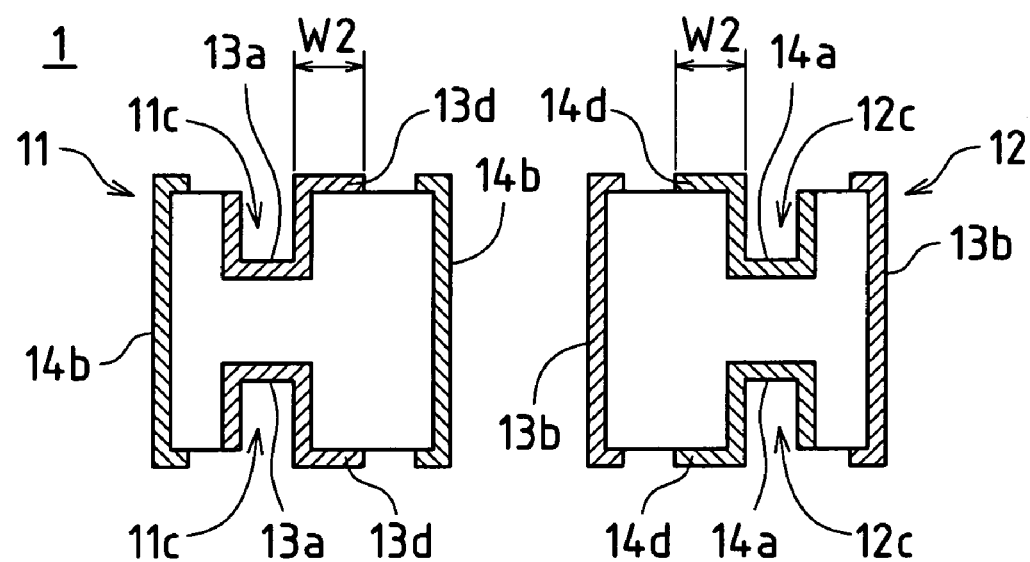
FIG. 5 is a cross-sectional view taken along line II—II in FIG. 4.

In this embodiment, the beside-groove electrodes 13d, 14d are formed along beside the groove portions 11c, 12c, leaving a distance between them. Alternatively, as shown in FIGS. 4 and 5, the outward extending groove electrodes 13c, 14c may be formed on the vertical walls (surfaces and side surfaces perpendicular to the leg portion major surface) of the groove portions 11c, 12c, and the beside-groove electrodes 13d, 14d may be integrated with the outward extending groove electrodes 13c, 14c. In this case, the electrode shape is simplified, thereby making it possible to improve the productivity and the stability of a connection between the in-groove electrode and the base portion electrode. In this embodiment, for example, it is assumed that the leg portions 11, 12 each have a width of 120 μm and the groove portions 11c, 12c each have a width of 60 μm. In this case, for example, the lengths (W) extending on the leg portion major surfaces 11a, 12a of the outward extending groove electrodes 13c, 14c are about 10 to 30 μm, the extending lengths (W2) of the beside-groove electrodes 13d, 14d are about 15 μm. Therefore, the electrode film is stably formed, so that the conductive resistance is not reduced and a short circuit is unlikely to occur between the electrode film and the side surface electrode or the connecting electrode.

Also in the tuning fork crystal resonator 1 of FIGS. 4 and 5, the outward extending groove electrodes 13c, 14c are formed on the vertical walls (surfaces and side surfaces perpendicular to the leg portion major surface) of the groove portions 11c, 12c, and the beside-groove electrodes 13d, 14d are integrated with the outward extending groove electrodes 13c, 14c. The present invention is not limited to this. The outward extending groove electrodes 13c, 14c may be formed only on the side surfaces (vertical walls) of the groove portions 11c, 12c, and the beside-groove electrodes 13d, 14d may be integrated with the outward extending groove electrodes 13c, 14c.

Figure 6:
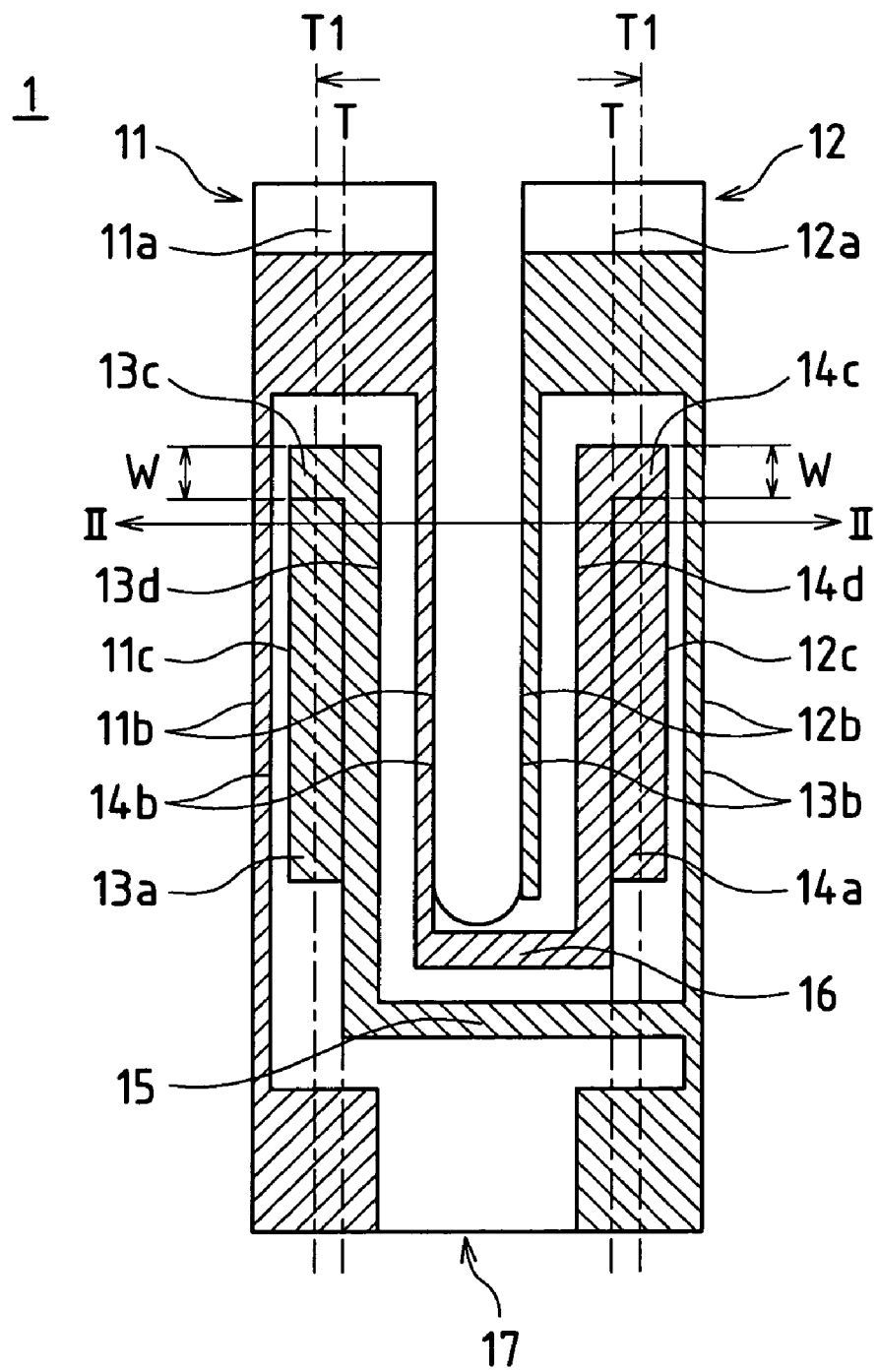
FIG. 6 is a plan view showing a tuning fork crystal resonator in which a connecting electrode having a form different from that of FIGS. 1 and 4.

Also in this embodiment, the connecting electrodes 15, 16 are formed into a structure as shown in FIGS. 1 and 4. The present invention is not limited to this. The connecting electrodes 15, 16 are formed into a structure as shown in FIG. 6. Specifically, the connecting electrodes 15, 16 may be connected only to the beside-groove electrodes 13d, 14d.

Also in this embodiment, the groove portions 11c, 12c of the leg portions 11, 12 are formed at positions shown in FIGS. 1 and 2, for example. This provides a preferred example in which the in-groove electrode is suppressed from being made contact with the inner side surface electrode and the inside connecting electrode. The present invention is not limited to this. Specifically, the groove portion formed in each leg portion needs to be deviated from the center line of the leg portion in the width direction of the leg portion major surface, while the beside-groove electrode needs to be deviated from the center line in the width direction opposite to that of the deviated groove portion. In other words, the groove portion may be formed at a position opposite to that of FIGS. 1 and 2 (a position approaching from the center of the tuning fork crystal resonator). Even in this case, it is possible to secure a region for forming the beside-groove electrode.

By mounting the tuning fork crystal resonator 1 having the above-described structure into a package (not shown), a tuning fork crystal unit is constructed.

Figure 10:
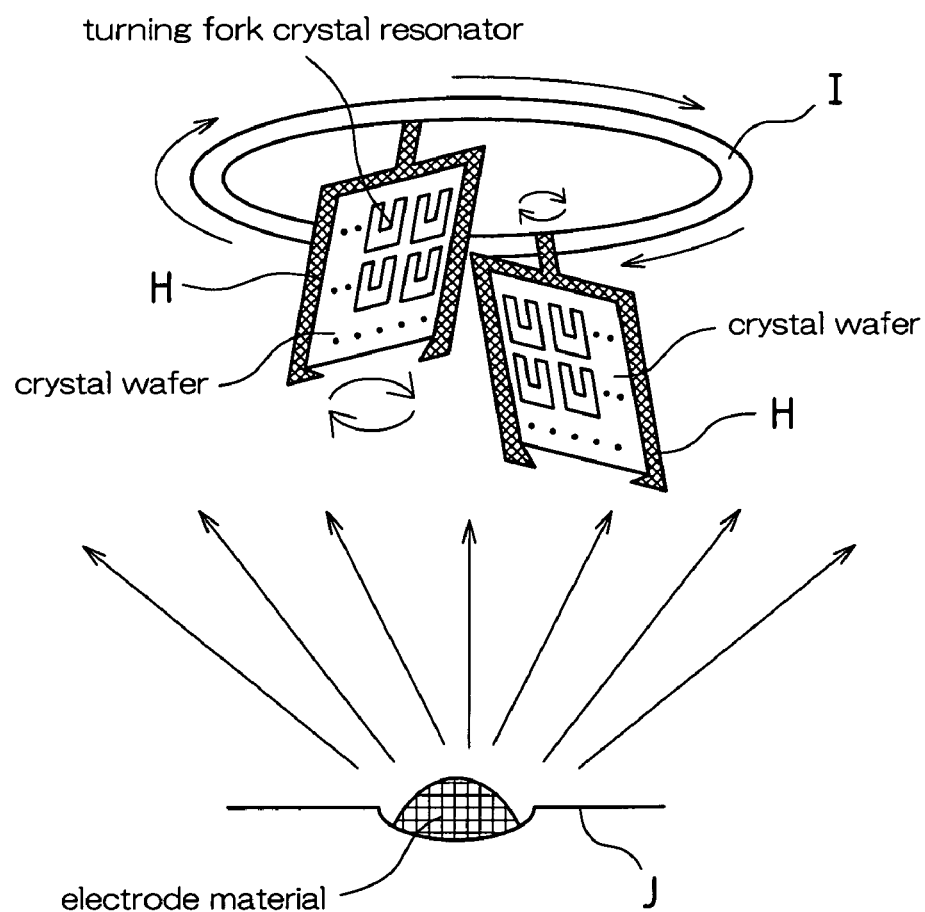
FIG. 10 is a schematic diagram of a vacuum deposition apparatus.

Next, a method of forming an electrode on the entire surface of the tuning fork crystal resonator using vacuum deposition will be described with reference to FIG. 10 schematically showing a vacuum deposition apparatus.

The tuning fork crystal resonator in a crystal wafer state is placed in a mask jig (not shown) and is fixed to a work holder H. The wafer is spaced by a predetermined distance from a deposition source J. A plurality of work holders H are attached to a turn table I that is horizontally rotated on a top surface of the deposition source. Each work holder H can rotate on its axis with respect to the turn table I. Each work holder H has an elevation angle of 45° with respect to the turn table I, for example. Each work holder H's rotation axis is tilted by 45° from a state of the work holder H facing the horizontal plane. In each tuning fork crystal resonator on the crystal wafer fixed to the work holder H, an edge on the base portion side of the tuning fork crystal resonator is closer to the deposition source than an edge on the leg portion side thereof, and the leg portion major surface of the tuning fork crystal resonator is tilted by 45° with respect to the deposition source.

Further, each work holder H rotates on its axis by 90° and is positioned again every time the turn table I is rotated by 120°. Therefore, an electrode material evaporated from the deposition source J is supplied to the crystal wafer while rotating the turn table I, thereby making it possible to apply the electrode material onto the entirety of the top and bottom surfaces and both side surfaces of each tuning fork crystal resonator.

By forming the electrode in this manner, it is possible to avoid a short circuit of each side surface electrode that is otherwise caused by formation of an unnecessary electrode in the crotch of each leg portion, since the crotch of the tuning fork crystal resonator is blocked from the view of the deposition source. Particularly, it is assumed that a tuning fork crystal resonator is formed by wet etching a crystal. If a small projection is formed in the crotch portion, so that an electrode is formed in this portion, it is difficult for a photosensitizing beam to reach a resist film in this portion during photosensitization. Therefore, it is difficult to achieve high-precision metal etching, resulting in a short circuit in each side surface electrode. In the present invention, this defect can be avoided. Further, as shown in FIG. 3, portions in the vicinity of the edges of the outward extending groove electrodes 13c, 14c (only 13c is shown) face the deposition source and are not blocked from the view of the deposition source, so that the electrode film is stably formed at the positions. Further, edges E1 (edges on the leg portion side of the groove portion) of the outward extending groove electrodes 13c, 14c have a thicker electrode than that of edges E2 on the base portion side of the groove portion, thereby avoiding a break.

Further, in this embodiment, as shown in FIG. 1, when the vertical walls of the groove portions 11c, 12c are formed perpendicular to the leg portion major surface, it is possible to stably form an electrode film without a break. Also, the vertical walls of the groove portions 11c, 12c may have an acute angle with respect to the leg portion major surface. Even in this case, it is possible to stably form an electrode film without a break.

Variations

Figure 7:
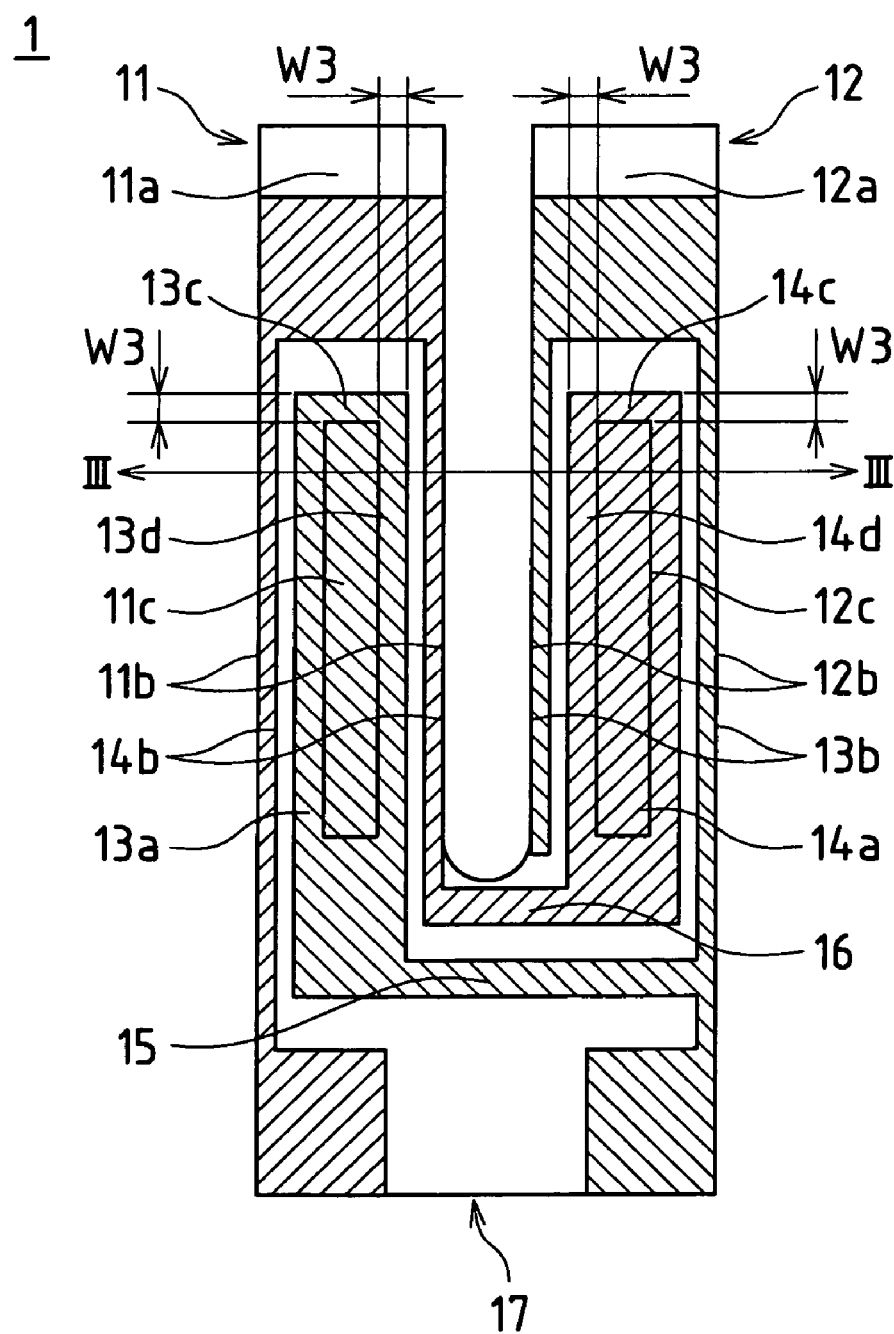
FIG. 7 is a plan view showing a tuning fork crystal resonator according to a variation of the embodiment of the present invention.
Figure 8:
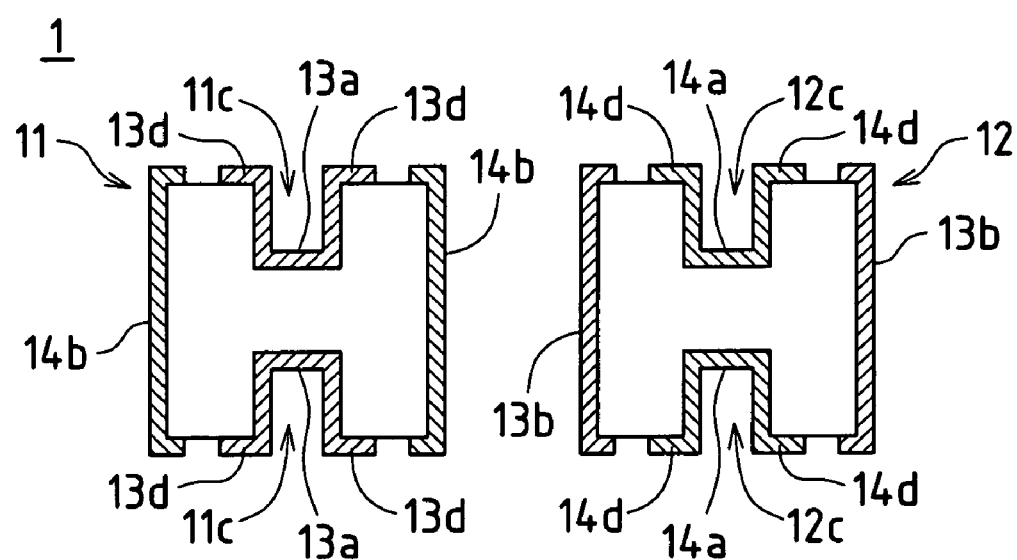
FIG. 8 is a cross-sectional view taken along line III—III in FIG. 7.
Figure 9:
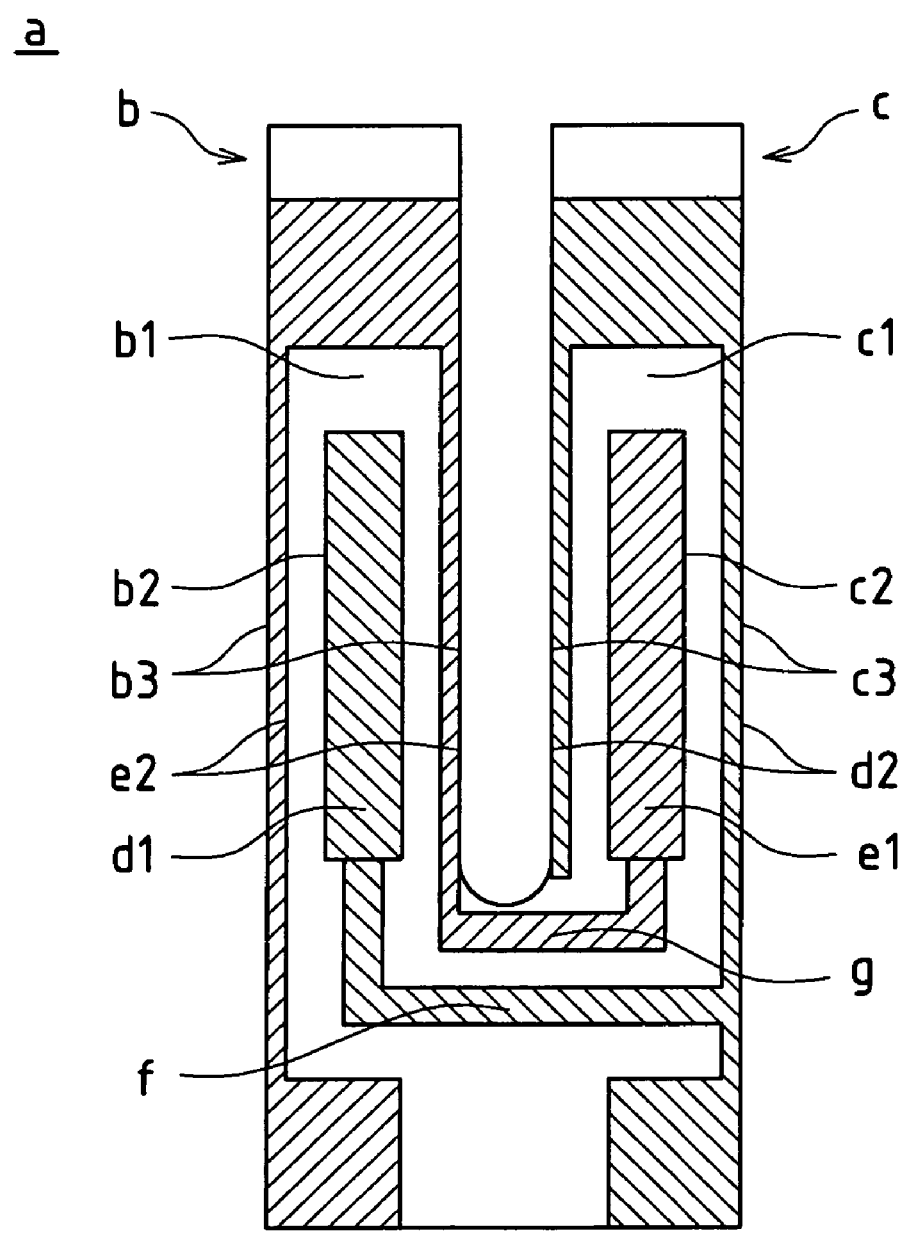
FIG. 9 is a plan view showing a conventional tuning fork crystal resonator.

Hereinafter, a variation of the present invention will be described with reference to the drawings. FIG. 7 is a plan view showing a tuning fork crystal resonator 1 included in a tuning fork crystal unit according to a variation of the above-described embodiment. FIG. 8 is a cross-sectional view taken along line III—III in FIG. 7.

In this example, a variation of the shapes of the groove portions 11c, 12c and the beside-groove electrodes 13d, 14d is shown. The groove portions 11c, 12c and the in-groove electrodes 13a, 14a are provided at centers in the width direction of the leg portion major surfaces 11a, 12a of the respective leg portions 11, 12. The in-groove electrodes 13a, 14a are formed throughout the inside of the groove portions 11c, 12c. In the plan view of FIG. 7, the areas of the in-groove electrodes 13a, 14a are set to be slightly larger than those of the groove portions 11c, 12c. Therefore, as shown in FIG. 8, the in-groove electrodes 13a, 14a are actually formed from the bottom surfaces of the groove portions 11c, 12c to the vertical walls thereof and the leg portion major surfaces 11a, 12a. An in-groove electrode extending on the leg portion tip-sides of the groove portions 11c, 12c and an in-groove electrode extending on both sides of the groove portions 11c, 12c are the outward extending groove electrodes 13c, 14c. The outward extending groove electrodes 13c, 14c are integrated with the beside-groove electrodes 13d, 14d. In this embodiment, for example, when the leg portions 11, 12 each have a width of 120 μm and the groove portions 11c, 12c each have a width of 60 μm, lengths (W3) extending on the leg portion major surfaces 11a, 12a of the in-groove electrodes 13a, 14a are about 10 μm.

The outward extending groove electrodes 13c, 14c are led to the connecting electrode (base portion electrode) 15, 16 via the beside-groove electrodes 13d, 14d formed on the leg portion major surface along both sides of the respective groove portion.

With this structure, the in-groove electrode groove portions 11c, 12c extending on the leg portion tip-side and the outward extending groove electrodes 13c, 14c extending on both sides of the groove portions 11c, 12c are integrated with the beside-groove electrodes 13d, 14d. Therefore, the electrode shape is simplified, thereby making it possible to improve the productivity and the stability of a connection between the in-groove electrode and the base portion electrode.

In the embodiment of the present invention, the present invention is applied to the tuning fork crystal resonator 1 having two leg portions 11, 12. The present invention is not limited to this. The present invention can be applied to a tuning fork crystal resonator having three or more leg portions. Further, although crystal is used as a piezoelectric material in the above-described embodiment, the present invention can be applied to a resonator made of others, such as lithium-niobate, lithium tantalite and the like.

The present invention can be embodied and practiced in other different forms without departing from the spirit and essential characteristics thereof. Therefore, the above-described embodiments are considered in all respects as illustrative and not restrictive. The scope of the invention is indicated by the appended claims rather than by the foregoing description. All variations and modifications falling within the equivalency range of the appended claims are intended to be embraced therein.

The present application claims priority on Patent Application No. 2003-200079 filed in Japan on Jul. 22, 2003, the entire contents of which are hereby incorporated by reference.

INDUSTRIAL APPLICABILITY

Particularly, a piezoelectric material is preferably used in a tuning fork crystal resonator of the present invention, a tuning fork unit comprising of the tuning fork crystal resonator, and a method of producing the tuning fork crystal resonator.

The invention claimed is:

1. A tuning fork resonator comprising a base portion and a plurality of leg portions extending in the same direction from the base portion in parallel to one another, wherein a groove portion is formed in a major surface of each leg portion, an in-groove electrode is formed in the groove portion, a side surface electrode is formed on a side surface of the leg portion, and the in-groove electrode and the side surface electrode are connected via a base portion electrode formed in the base portion, wherein
   an outward extending groove electrode extending on at least one of a vertical wall facing the base portion of the groove portion and a vertical wall that is a side surface of the groove portion and a leg portion tip-side major surface from the in-groove electrode of the groove portion, and a beside-groove electrode for leading the outward extending groove electrode on the leg portion major surface along beside the groove portion to the base portion electrode, are formed.

2. The tuning fork resonator according to claim 1, wherein the outward extending groove electrode is formed on at least the vertical wall that is the side surface of the groove portion, and
   the beside-groove electrode is integrated with the outward extending groove electrode.

3. The tuning fork resonator according to claim 1, wherein the groove portion formed in each of the plurality of leg portions is deviated from a center line of the leg portion in a width direction of the leg portion major surface, and the beside-groove electrode is deviated from the center line in the width direction opposite to that of the deviated groove portion.

4. The tuning fork resonator according to claim 3, wherein the groove portion is deviated from the center line of the leg portion in a direction away from another leg portion parallel thereto, and the beside-groove electrode is deviated from the center line of the leg portion in a direction approaching the other leg portion parallel thereto.

5. The tuning fork resonator according to claim 1, wherein an electrode formed at an edge of the outward extending groove electrode is thicker than an electrode formed at an edge on a base portion side of the groove portion.

6. The tuning fork resonator according to claim 1, wherein the vertical wall of the groove portion is at a right or acute angle with respect to the leg portion major surface.

7. A tuning fork unit comprising the tuning fork resonator according to claim 1, wherein the tuning fork resonator is mounted in a package.

8. The tuning fork resonator according to claim 2, wherein the groove portion formed in each of the plurality of leg portions is deviated from a center line of the leg portion in a width direction of the leg portion major surface, and the beside-groove electrode is deviated from the center line in the width direction opposite to that of the deviated groove portion.

9. The tuning fork resonator according to claim 8, wherein the groove portion is deviated from the center line of the leg portion in a direction away from another leg portion parallel thereto, and the beside-groove electrode is deviated from the center line of the leg portion in a direction approaching the other leg portion parallel thereto.

10. The tuning fork resonator according to claim 2, wherein an electrode formed at an edge of the outward extending groove electrode is thicker than an electrode formed at an edge on a base portion side of the groove portion.

11. The tuning fork resonator according to claim 3, wherein an electrode formed at an edge of the outward extending groove electrode is thicker than an electrode formed at an edge on a base portion side of the groove portion.

12. The tuning fork resonator according to claim 8, wherein an electrode formed at an edge of the outward extending groove electrode is thicker than an electrode formed at an edge on a base portion side of the groove portion.

13. The tuning fork resonator according to claim 4, wherein an electrode formed at an edge of the outward extending groove electrode is thicker than an electrode formed at an edge on a base portion side of the groove portion.

14. The tuning fork resonator according to claim 9, wherein an electrode formed at an edge of the outward extending groove electrode is thicker than an electrode formed at an edge on a base portion side of the groove portion.

15. The tuning fork resonator according to claim 2, wherein the vertical wall of the groove portion is at a right or acute angle with respect to the leg portion major surface.

16. The tuning fork resonator according to claim 3, wherein the vertical wall of the groove portion is at a right or acute angle with respect to the leg portion major surface.

17. The tuning fork resonator according to claim 8, wherein the vertical wall of the groove portion is at a right or acute angle with respect to the leg portion major surface.

18. The tuning fork resonator according to claim 4, wherein the vertical wall of the groove portion is at a right or acute angle with respect to the leg portion major surface.

19. The tuning fork resonator according to claim 9, wherein the vertical wall of the groove portion is at a right or acute angle with respect to the leg portion major surface.

* * * * *